United States Patent [19]

Canteloup et al.

[11] 4,207,834

[45] Jun. 17, 1980

[54] PROCESS AND DEVICES FOR THE ELABORATION OF PREFORMS FOR OPTICAL FIBERS

[75] Inventors: Jean Canteloup, Montlhery; Alain M. Mocellin, Evry; Michel A. Braguier; Roger J. Tueta, both of Paris, all of France

[73] Assignees: A.R.M.I.N.E.S., Paris; Etat Francais, Issy-les-Moulineau, both of France

[21] Appl. No.: 951,012

[22] Filed: Oct. 13, 1978

Related U.S. Application Data

[63] Continuation-in-part of Ser. No. 794,991, May 9, 1977, abandoned.

[51] Int. Cl.² ............................................. B05C 5/00
[52] U.S. Cl. ................................. 118/620; 118/308; 118/311; 118/312; 118/600
[58] Field of Search ............... 118/49.5, 620, 308, 118/600, 311, 312

[56] References Cited

U.S. PATENT DOCUMENTS

| | | | |
|---|---|---|---|
| 3,519,479 | 7/1970 | Inque et al. | 118/49.5 |
| 3,658,572 | 4/1972 | Chu | 427/3 X |

*Primary Examiner*—Bernard D. Pianalto
*Attorney, Agent, or Firm*—Abraham A. Saffitz

[57] ABSTRACT

An apparatus for producing preforms for the production of optical fibers by plasma coating and drawing. A plasma stream produced with the aid of a radio frequency generator is caused to successively pass through three zones in the first of which a mixture of fluidized powders of two materials of appropriate composition is injected and completely vaporized. In the second zone an oxidizing gas having a mixing action is introduced into the deeply cooled stream. The materials and gas react with each other to form microseeds. The powders contain high purity silicon and at least one doping element of the group comprising Al, Ge, B. Ti and Zr. In the third zone an inert gas is introduced and deposition of substance is effected on substrates suitably arranged with respect to the path followed by the plasma stream.

3 Claims, 6 Drawing Figures

FIG. 3 *PRIOR ART*

PROCESS AND DEVICES FOR THE ELABORATION OF PREFORMS FOR OPTICAL FIBERS

CROSS REFERENCE TO RELATED APPLICATIONS

This application is a continuation-in-part of our application, Ser. No. 794,991, filed May 9, 1977 and now abandoned.

FIELD OF THE INVENTION

This invention relates to an apparatus for the production of preforms intended for the production of optical fibres simply by plasma coating and subsequent drawing.

DESCRIPTION OF THE PRIOR ART

An article by Jean Canteloup and Alain Mocellin entitled "Synthesis of Ultrafine Nitrides and Oxynitrides in an R. F. Plasma," published in the proceedings of the Sixth Symposium on Special Ceramics entitled "Special Ceramics ,6" pages 333 through 345, published in 1975 by Paul Popper, Stoke-on-Trent, England discloses a process in which, for the purposes of producing nitrides or oxnitrides in the form of ultrafine powders:

1. a powder consisting of an element such as Si, Al or a mixture of these, such powder being fluidized by a conveying gas, is injected into a vaporization chamber at the head of and coaxially with a plasma stream;
2. a reactive gas such as $NH_3$, possibly with the addition of oxygen, is injected into the tail of the plasma stream from the periphery of an intermediate or reaction chamber to form the desired nitride or oxynitride; and
3. the ultrafine powder of this nitride or oxynitride is collected, at least in part, on a deeply cooled wall in a third or quenching chamber.

This process cannot be used for the production of preforms requiring, at every instant of preform manufacture, a uniform and homogeneous deposit on the entire lateral surface of at least one substrate formed in a generaly elongated prismatic or cylindrical shape.

Miederer et al, U.S. Pat. No. 3,226,270, granted Dec. 28, 1965, relates to a method of crucible-free production of gallium arsenide rods. The specific semiconductor rods are prepared from alkyl galliums and arsenic compounds at low temperatures. The method of this patent teaches the provision of a current of hydrogen from a storage container to sweep a hydrogen current through a supply of a gallium compound in a gallium container. A flow meter measures the rate of flow of the hydrogen current laden with the gallium compound. Another storage container supplies a current of hydrogen to pick up arsenic compound from an arsenic compound container. The hydrogen current laden with arsenic compound passes through another flow meter. Thus the amount of gallium compound and the amount of arsenic compound are known beforehand in each stream. Proportioned amounts from each stream are mixed in a reaction chamber under thermal conditions and desired molecular proportions react in the same proportion of the gallium arsenide semiconductor which is formed in the reactor vessel.

DISTINCTIONS OVER THE PRIOR ART

The present invention, therefore, starts from an apparatus related to the aforesaid prior art which comprises means causing a stream of plasma to pass through a first zone in which a hot plasma is formed by radio frequency induction means in a stream of plasma-producing gas into which a mixture of at least two finely powdered materials is added of types and proportions corresponding to the composition of the substance making up the preforms . Fluidizing means are provided for delivery of the mixture in the fluidized state in a carrier gas which is continuously injected at the head of and coaxially with the stream through injector means into a reactor. The entire stream passes through a vaporizing zone of the reactor so as to completely vaporize the materials in the first zone. Turbulent mixing occurs in a second zone of the reactor in which at least one gas is provided for mixing action. Simultaneously there occurs a chemical reaction with the material entering said second zone in the vapor state. The chemical reaction is then quenched by cooling in the reactor down to a temperature below that of the second zone to about 5,000 degrees Centigrade in a gradual gradient which drops from high temperature to a cooler temperature at the periphery of the reactor. In this manner the materials and the gas react with one another and begin to form microseeds of the mixture of the substance and these microseeds finally collect in a third zone below the reactor for the formation of the preforms.

The present invention differs from the cited prior art with respect to the following points:

(a) the powders of the injected fluidized mixture are of a kind and proportion that, using the apparatus of the invention and following oxidation, allow very accurate formation of the substance constituting the coating on the substrates. More particularly, the use of a finely divided, high purity silicon as a starting material provides a matrix which is equally as pure as said starting materials with an advantageous yield for the preforms.

(b) the gas injected in the intermediate zone of the reactor vessel is also of a kind appropriate to the objective under the conditions prevailing at the injection point in the apparatus of the type of Miederer, U.S. Pat. No. 3,226,270, i.e., the entry of the powder reactants in a vapor state with extremely high thermal agitation and natural or forced temperature reduction (by about 5 ,000 degrees Centigrade) which this injected gas simultaneously allows.

(c) Oxidation of Si and $SiO_2$ and dissolution of the dopant directly and by its stirring action within the core of the stream.

(c) Some purification of the coating substance because the high temperatures, of the order of 6,000 to 10,000 degrees Centigrade, enable OH ion contents of the original powders to be considerably reduced. Additionally, the formation of volatile oxides and sub-oxides in the reaction zone and the subsequent selective distillation of the vapors toward the relatively cold periphery surrounding the plasma stream serve to further reduce the residual impurity content of the doped silica which is then deposited on the substrates.

(e) Formation of microseeds of the substance to be deposited with the qualitative and quantitive compositions required for the coating substance, the proportions of the elements in the composition of this substance corresponding to that in which they existed in the initial mixture, no longer exists only as a statistical average but is now on the sub-micron scale (for example, of the order of 100 Å).

(f) The final zone remains a condensation zone but, in this case, the stream of plasma therein, at least at the level of the substrates to be coated, is in a state of flow which now has only enough turbulence as is required for deposition. The substrates are placed in front and in the direction of the path which is followed by the stream, no longer at the periphery thereof, these two conditions combining for good uniformity of the coating over the entire periphery and length of the substrates.

OBJECT OF THE INVENTION

The object of the invention is to adapt the apparatus of the present invention to the above described process for the industrial production of preforms for optical fibres. It has been found that, once the process is adapted to the apparatus, it enables fibres of better quality and lower cost to be produced in comparison with all other known processes and apparatus relating to the production of such fibres.

SUMMARY OF THE INVENTION

To this end, the process as defined above is characterized in that ultrafine powders are uniquely selected from a high purity silicon and at least one doping element selected from the group consisting of Al, Ge, N, Ti and Zr, or a compound of one of these elements such as oxide, halide, etcetera, and in that proportions, at least statistically, corresponding exactly to those required for the preform. The gas introduced into the secong zone is an oxidizing gas consisting of oxygen which may or may not be diluted with an inert gas such as argon. The third zone is an area in which, when the stream has resumed a less turbulent state of flow (Reynolds number RE 3500), the deposition of the substance is carried out directly on substrates which are tubes or mandrels placed in front and in the direction of the path followed by the stream.

The apparatus of the present invention relates to the production of preforms used for optical fibres and comprises a radio frequency electrical energy generator and a reactor with three zones connected to one another, the three zones being of increasing diameters from top to bottom. These three zones are disposed successively, the first, made of quartz, being a vaporization zone provided with a lateral injector for plasma producing gas and further provided with a coaxial injector for fluidized powder mixture and an outer induction winding for creating maximum heating. The second or "reaction" zone is of generally frustro-conical shape and is provided with means for the injection of oxidizing gas to oxidize the injected silicon and dopant. The third zone is a deposition zone for depositing microseeds. The first and second zones are coaxial and provided with a double lateral casing for a flow of coolant liquid. The apparatus further comprises means for the storage, distribution, purification and control of the rates of flow of said plasma producing gas, powder conveying gas and oxidizing gas, as in the Miederer, U.S. Pat. No. 3,226,270. Finally, means are provided for the storage, purification, supply and mixing of the powders. The powder mixing means may be provided with means for adjusting, by way of the rates of flow, the proportions of said powders in the mixture, as in Miederer, possibly with control of these proportions. The deposition zone at the bottom of the reactor comprises means for supporting the substrates in a suitable position and in a desired orientation.

MATERIAL AND GAS SELECTION

It is advantageous to fulfill one or more of the following conditions:
the powder conveying gas and the plasma producing gas are pure oxygen or oxygen diluted with an inert gas, such as argon, depending upon the power of the generator;
the silicon powder used is obtained from pulverizing a bar which is itself obtained by zone melting or any other purification method; as a guide, silicon originating from zone melting contains only some tens of nanograms of impurities such as Fe, Cu, per gram of Si;
the actual preform formation stage is preceded and, if required, followed in time by a stage in which the substrates are swept by the stream of plasma without injection of powder mixture; the preliminary stage is obviously intended to bring the tubes to an equilibrium temperature which they then retain during the actual deposition stage; in the final (optional) stage it has the effect of heat treatment or sintering of the resulting coating to give the latter a better hold for subsequent drawing of the preform into optical fibres;
finally, the invention also has the great advantage, which is of use for the production of preforms with an index gradient, of allowing variation of the quantitative and/or qualitative composition of the coating substance according to a law predetermined as a function of the thickness already deposited, either continuously or intermittently, for which purpose the proportions and/or kinds of the constituents of the mixture of powders injected are varied correlatively against time and according to a predetermined program.

INDEX GRADIENT CHARACTERISTICS

Several processes are undoubtedly already known for the production of preforms with an index gradient. Some of them operate by means of a thallium-potassium or thallium-sodium ion exchange accelerated by electromigration, while others operate by deposition following a chemical reaction in the vapor phase (chemical vapor deposition) or after flame hydrolysis on a silica mandrel, which is eliminated before drawing into fibres.

The preforms produced by electromigration processes give fibres whose minimum attenuation is about 10 dB/km for a wavelength of 0.8 $\mu$m and the cost price of which is rather high because of the low speed of the diffusion process which consequently affects the speed of drawing of the preform to fibre. The free preforms produced by the vapor deposition processes give fibres whose minimum attenuation is of the order of 5 dB/km (for the above given wavelength) but for their cost price is still relatively high because of the low speed of deposition permitted by this method and the fact that each tube requires its own mechanical means (rotary and translatory drives) and its own thermal means (blow pipe, oven, etcetera). The preforms produced by flame hydrolysis processes undoubtedly give high deposition speeds in comparison with the preceding processes and satisfactory optical characteristics, but they require the use of mandrels as deposition supports which have to be eliminated before drawing.

The process of the invention applied to the production of optical fibres with an index gradient enables the disadvantages and limitations of the known processes as indicated above to be substantially obviated.

PREFERRED APPARATUS FEATURES

The apparatus required for performing the process according to the invention comprises an assembly consisting of a radio frequency electrical energy generator, and a generally cylindrical, double walled reactor comprising first, second and third communicating chambers lying along a common vertical axis in superposed relation with the first chamber being smaller in diameter on top, the second chamber being larger in diameter below and the third chamber being largest in diameter on the bottom. The three zones in the first, second and third chambers respectively are openly connected to one another and are disposed successively as a vaporization zone, a reaction zone and a deposition zone in said first, second and third chambers respectively. The first zone within the first and narrowest chamber at the top is made of quartz and constitutes a vaporization zone which is provided with a lateral injector for injection of plasma producing gas which fluidizes powder entering into the first zone in a gas mixture containing an inert gas, such as argon, and oxygen diluted by such inert gas. In order to introduce the fluidized powder mixture a coaxial injector is provided which brings the fluidized powder particles and gases in a direction which is tangential and transverse to the axis of the reactor. The common injection orifice of the plasma producing gas and fluidized powder mixtures is located at the top of the reactor above the first chamber so as to be substantially coaxial with all of the three zones and three chambers in which the zones reside. In order to raise the temperature of the fluidized powder mixture and plasma producing gas in the first zone, a radio frequency electrical generator is provided with an outer induction winding which surrounds the first chamber and the first zone to thereby assure an increase in temperature of the order of 6,000 to 10,000 degrees Centigrade.

A chemical reaction occurs on the injection of oxygen into the second zone of the reactor. This second or chemical reaction zone is of generally frustro-conical shape and is provided with means for injection of oxidizing gas. In the widest part of the reactor there is provided the third zone at which deposition takes place. This third deposition zone lies immediately below the second reactor zone and together with the first and second zones is coaxial. The third cylindrical chamber surrounding the third deposition zone is strongly cooled in order to reduce the temperature quickly and for this purpose the lower portion of the reactor is provided with a double lateral casing for a flow of a coolant liquid. Means for the storage, distribution, purification and control of the rates of flow of the plasma producing gas, the powder conveying gas and the oxidizing gas are provided as well as means for storage, purification, supply and mixing of the powders.

The apparatus of the invention is characterized in that the said powder mixing means are themselves provided with proportioning means for adjusting, by way of the rates of flow, the proportions of said powders in the mixture with continuous or discontinuous control of these proportions and in that the deposition zone comprises means for supporting the substrates in a suitable position and orientation.

Advantageously, the said powder means comprises at least two rotary blade distributors through which the said powder conveying gas flows.

In the specific case of the production of fibres with an index gradient, the said means for controlling the proportions of the powders in their mixture comprises a system for varying the speed of rotation of the drive motor for the blade of at least one of said distributors.

In the case of the production of preforms for optical fibres, in order to reduce contamination by water vapor and reduce atmospheric impurities to a minimum.
- the substrate tubes are chemically pickled and kept in a clean and dry atmosphere;
- the plasma producing gas and the powder mixture conveying gas are dried and filtered by a system of molecular screens and filters;
- the powders are dried in a vacuo at 400 degrees Centigrage for 24 hours; and
- once the tubes have been coated they are disposed in a sealed container for their transportation and storage until drawing.

The coatings produced have a structure and adhesion which enables them to withstand operations such as heat treatment at high temperature and conversion of the preforms into optical fibres without flaking off or fracturing.

BRIEF DESCRIPTION OF THE DRAWINGS

The invention will be more readily understood from the following description of the FIGS. of the drawings.

DESCRIPTION OF THE PREFERRED EMBODIMENT

Figure 1:
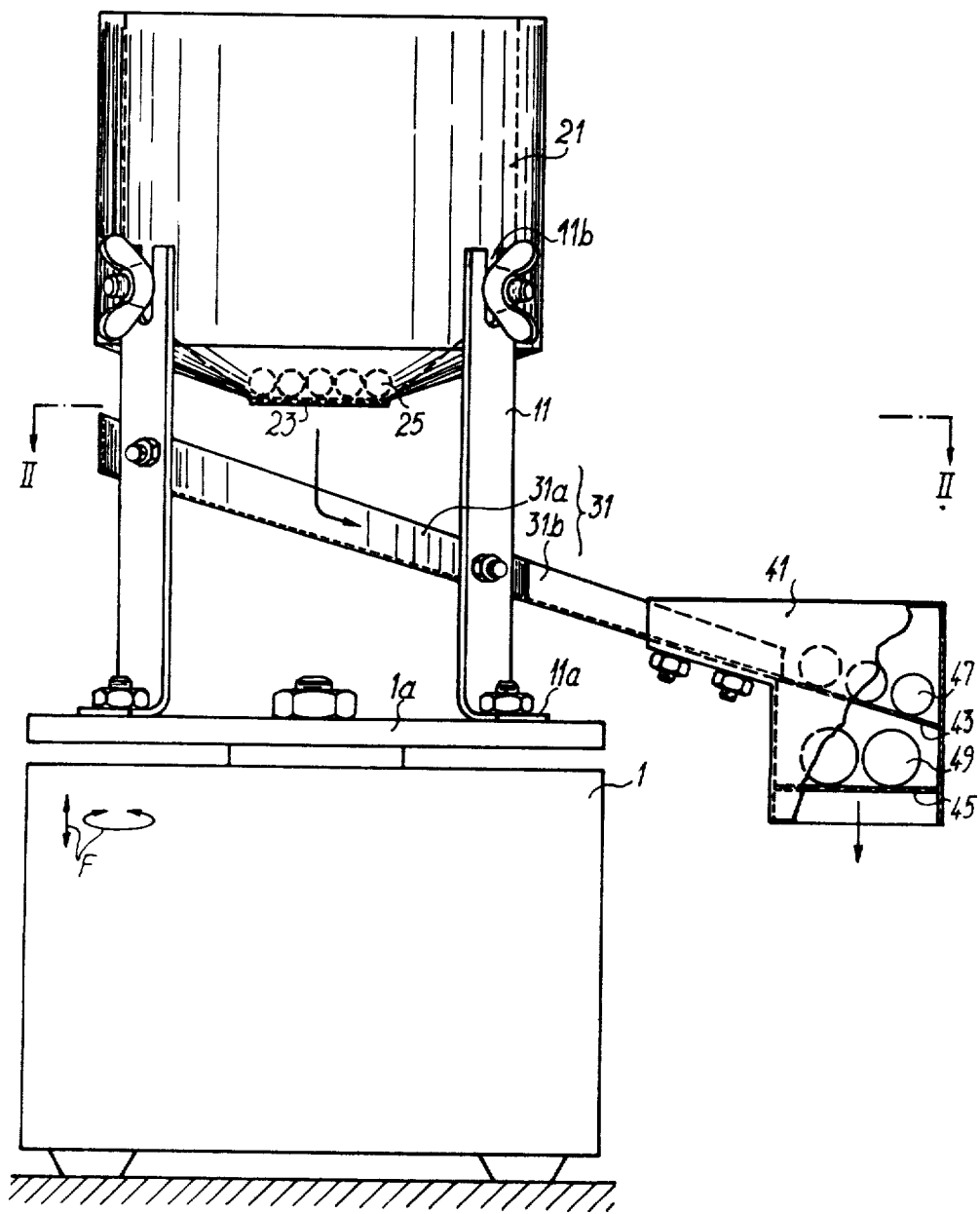
FIG. 1 illustrates schematically an example of a prior art powder distributor device which is disclosed in French Pat. No. 2,215,374.
Figure 2:
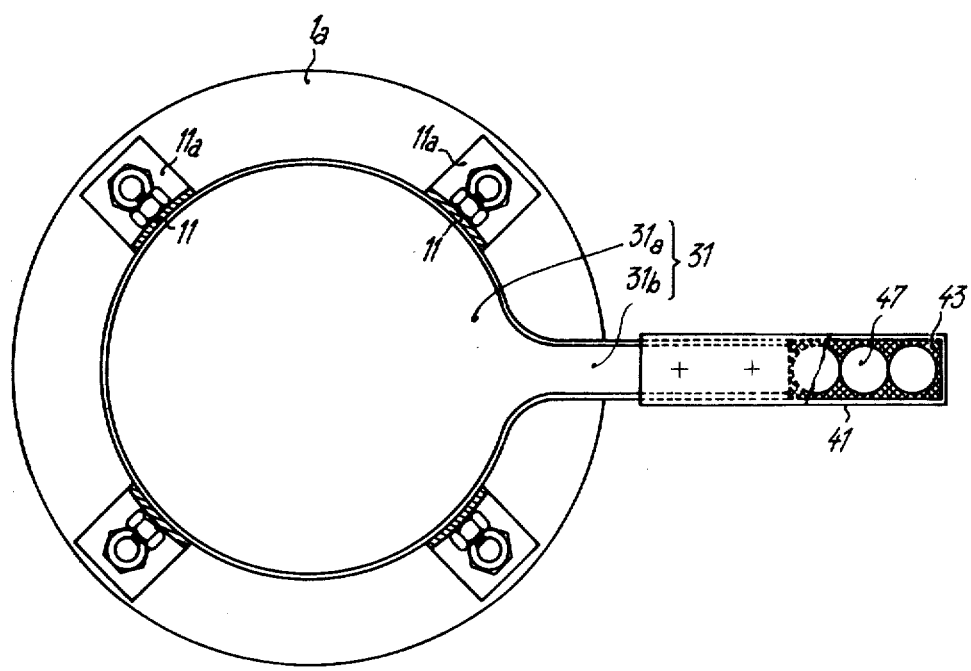
FIG. 2 is a cross sectional view of the prior art example taken along the line II—II in FIG. 1 showing the neck and the end box of the powder distributor device.

Referring to FIG. 1, the powder distributor device described in the French Pat. No. 2,215,374, which is useful in the present invention, comprises:

(a) a support arrangement which is made up of flat iron uprights 11 attached by flanged feet 11a and by screws to upper plate 1a of an electromagnetic vibrator 1 producing vibrations both translational in the vertical direction and rotational about this vertical direction as shown by arrows F;

(b) a feeder 21 having a general cylindrical shape with no upper front wall, a truncated projecting base, the lower section of which is formed by a removable and interchangeable sieve 23, its mesh being chosen in relation to the granulometry of the powder load to be distributed, which slips in between uprights 11 to which it is attached but which remains detachable by means of threaded rods projecting radially outwardly and fitted with butterfly nuts, the rods fitting into slots 11b of uprights 11;

(c) an intermediate section 31, such as shown in detail in FIG. 2, the base part of which, with a continuous downward slope, ensures the gravitational transfer of the powder from the previous section to the following one in the general form of a neck, the upper part 31a of which opens out into a circular tray coaxial to the sieve 23 to cover most of the free space inside support arrangement 11 and the lower part 31b of which has a virtually rectangular and relatively narrow cross section, the neck 31 being fixed diametrically in support arrangement 11 and detachably held in place by means of clamps secured by bolts to the support; and (d) a distributor 41 in the form of a relatively narrow box with side walls having an L-shape, this box being completely closed except for the small front opening required so that it can be easily pushed and fixed, by bolts for example, onto the outlet end of the neck 31 and a large lower opening for letting the powder out, the distributor 41 being enclosed in a horizontal direction or thereabouts and having two sieves 3 and 45 set one above the other, the mesh of the upper sieve being coarser than that of the lower one, and two rows of balls 47 and 49 lying on top of the sieves 43 and 45 with the three upper balls having smaller diameters than the two lower ones.

The powder distributor operates as follows. The electromagnetic vibrator 1, whose vibrational amplitude in the two aforementioned directions can be set, for example, by means of a potentiometer in the current supply circuit (not shown), agitates the feeder 21, the neck 31 and the distributor 41 assembly. By agitating the feeder 21 the powder drops through the sieve 23, the dimensions of the possible agglomerates being determined by the sieve's mesh. As a result of neck 31 being agitated, and it being inclined, the powder moves down towards the outlet to fall finally into the box 41. This box 41 undergoes, due to the length of the neck 31, vibrations having a relatively large amplitude which causes increased agitation of the powder and rotational movement of the balls 47 and 49. Those on the upper sieve 43, due to this movement, crush the agglomerates falling into this sieve 43. The resulting particles fall through onto the lower, finer sieve 45 where the second ball set 49 makes the powder leaving the powder distributor device even finer.

Figure 3:
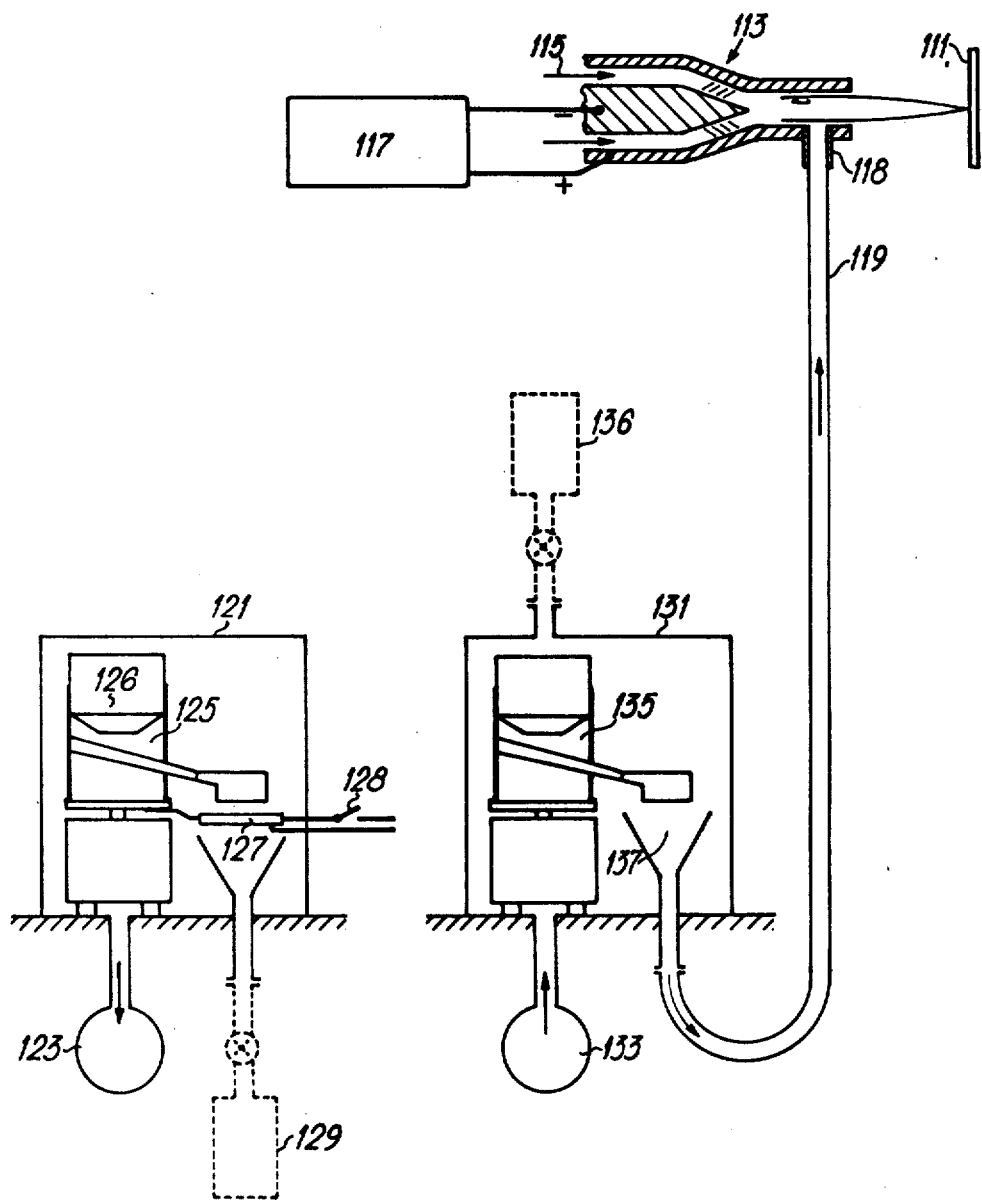
FIG. 3 shows schematically a prior art example of a powder distributor installation including two powder distributor devices.

FIG. 3 illustrates a diagram of an installation which relates to the formation of an $Al_2O_3$ deposit on a substrate 111 by means of a plasma torch 113. The torch 113 is fed with a plasma producing gas 115, such as argon, helium or nitrogen. The torch 113 is connected to an electric generator 117 which creates an arc between the two electrodes which receives from powder injector 118 the fine powder for the formation of the deposit in the form of a powder conveying gas 119, such as argon. The powder is prepared in the following manner. The powder drying process takes place in the first chamber 121 coupled to a vacuum pump 123 and enclosing a first powder distributor device 125. This powder, coming from a loose load 126, falls onto a heating plate 127 which is vibrated by the same vibrator 125. The traces of water evaporate and are sucked away towards the vacuum pump. The powder is stored in a sealed container 129 and kept under a vacuum.

In a second chamber 131 linked to an argon storage station 133 and housing a second powder distributor device 135, the powder fluidizing process is carried out. This powder, coming from the previous container and carried in 136, falls onto a funnel 137 where it is conveyed by the argon slightly under pressure in the chamber to the powder injector 118 of the plasma torch 113.

Figure 4:
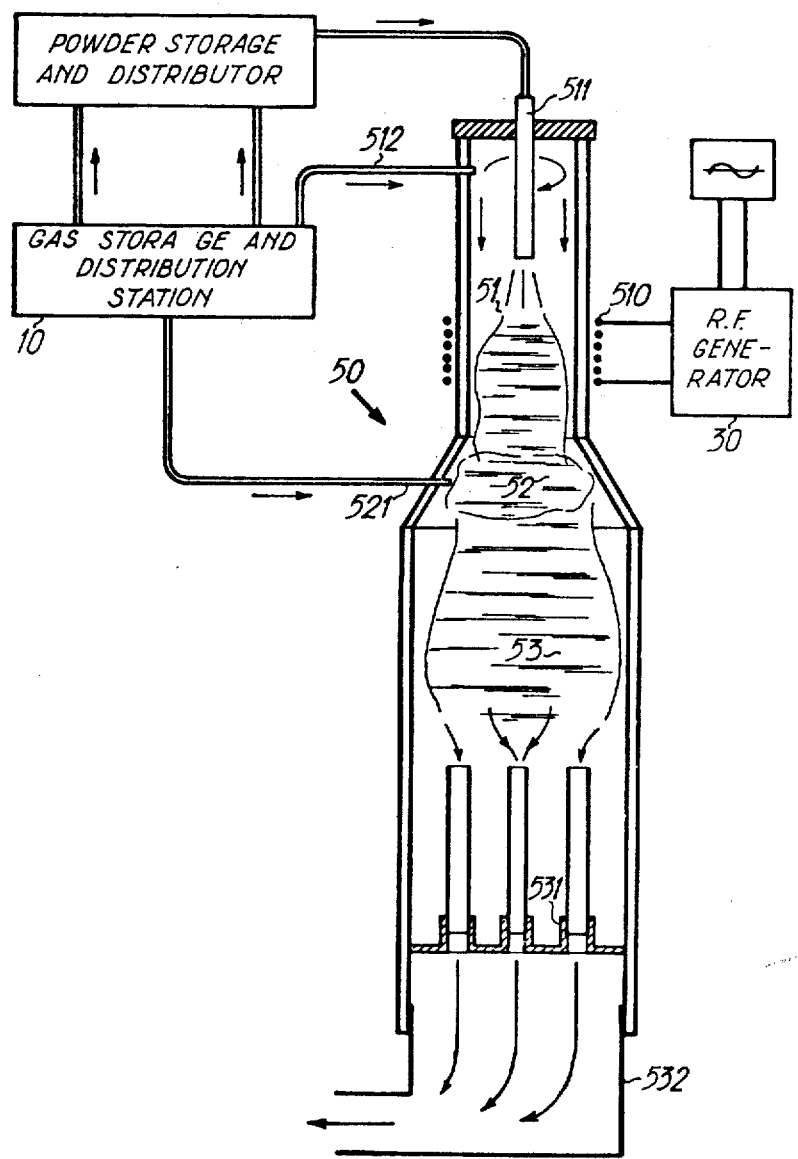
FIG. 4 is a diagram of the system of the invention, partly in block form and partly in side elevational view, of a complete installation including two powder distributor devices and showing the method of the invention.
Figure 5A:
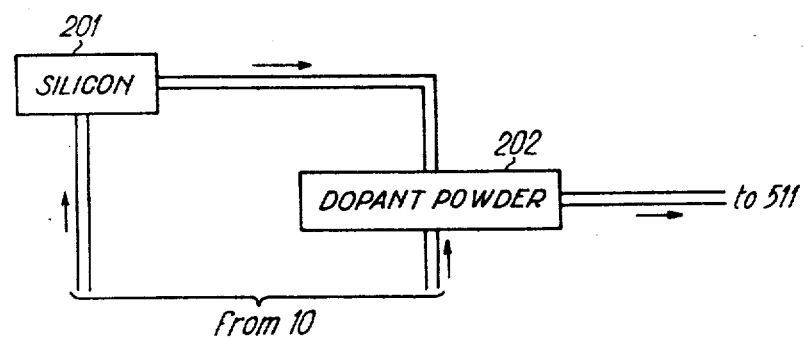
FIGS. 5A and 5B show the combination of the silicon powder distributor and the dopant powder distributor in the system of the invention for use in FIG. 4.
Figure 5B:
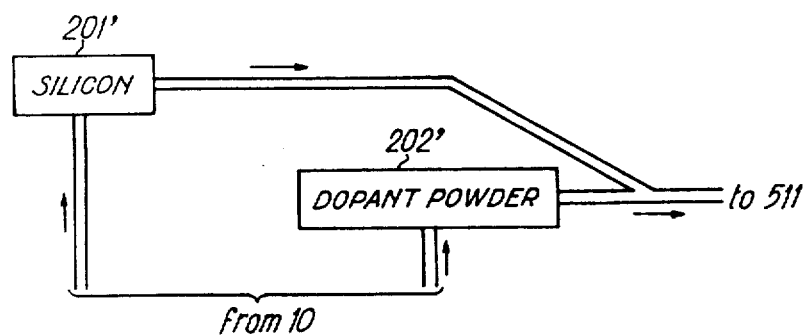

Referring to FIGS. 4, 5A and 5B, the system of the invention, especially adapted for the preparation of preforms for the production of optical fibres having an index gradient, simply by drawing, comprises essentially the following components:

a gas storage and distribution station 10 comprising means for the storage, distribution, purification and control of the rates of flow of the powder conveying gas, the plasma producing gas and oxygen;

powder storage and distribution means 20 for the storage, purification, distribution, control of the rates of flow and mixing of silicon powder 201 and dopant powder 202 respectively;

a radio frequency generator 30 for producing electrical energy at radio frequency; and a ractor-quencher 50 comprising three chambers 51, 52 and 53 for preheating to plasma vaporizing condition, reacting and quenching respectively, these three chambers 51, 52 and 53 being disposed coaxially and successively in the downward vertical direction, communicating with one another and all having a double side wall for the flow of a coolant such as water.

The fluidized mixture of powders, silicon powder from silicon powder supply 201 and dopant powder from dopant powder supply 202, are mixed in the inlet pipe as shown in the top conduit market with arrows from 201 to 202 and thence into axial injector 511 at the top portion of FIG. 4. The flow of the plasma producing gas, preferably argon or oxygen which is diluted with an inert gas, is shown in FIG. 4 as entering below the cap at the top and above the bottom of the axial injector to create a tangential high velocity current of the plasma producing gas injector, which is transverse to the vertical powder injector 511 lying along the vertical axis of the preheater. The plasma producing gas moves at a substantially higher velocity through tangential injector 512 than the velocity of the powder carrying gas bringing in the desired proportions of silicon powder and dopant powder. Although the dopant powder illustrated in the Example hereinbelow is aluminum, germanium, boron, titanium or zirconium may serve as the dopant powder used in a minor amount. The primary powder is high purity silicon powder of ultrafine grade in a major amount.

Under the heating action of induction winding 510 fed by radio frequency electrical energy generator 30, the temperature of the mixture of silicon powder and dopant powder is rapidly brought to the vaporization temperature of these metal powders in the quartz preheating chamber 51.

Chamber 51 is made of quartz and is of cylindrical shape. It is surrounded by the induction winding 510 fed by the generator 30. The top cover of this chamber has extending through it the powder feeding injector 511 which projects in the axial direction downwardly from the top cover to a point below the entry of the plasma producing gas and serves to introduce the powder axially below the entrance of the plasma producing gas into chamber 51. The injector 512, as shown in FIG. 4, comes in above the location for the powder conveying gas and the flow path of the plasma producing gas is transverse and tangential before any heating by conduction winding 510 occurs on the mixture of powder and the plasma producing gas.

The chamber 52, or the connecting sleeve, is of a metal such as stainless steel and is of frusto-conical shape. Extending through its side wall are at least three oxygen injectors distributed uniformly over its periphery (only one is shown at 521).

The hot plasma which bears vapors of the two finely powdered metal and dopant materials undergoes chemical reaction in the vapor state of the metals, e.g., silicon and dopant, with oxygen at a temperature which is even higher than the temperature in the preheating zone in chamber 51 under the heating action of induction winding 510. The silicon is quickly converted into silicon dioxide or silica in the vapor phase and the aluminum or similar dopant is converted into alumina in this reactor zone defined by the frusto-conical shape of the connecting sleeve described as stainless steel above.

Chamber 53 is of a metal such as stainless steel and is of cylindrical shape. It contains a support 531 for substrates disposed therein before-hand and each comprises a mandrel of a material such as silica or graphite, or a tube made of a material such as silica. Extending through the base of this chamber is a conduit 532 for discharge of the stream of gas to atmosphere.

According to an example of embodiment of the invention, optical fibres were produced by the following procedure:

four silica tubes of inside-outside diameters of 13 and 15 millimeters respectively and a length of 400 millimeters were cleaned so that the interior surface of the wall of the tubes was perfectly clean. These tubes were then placed vertically in the coating chamber (third or bottom zone) of an oven on a device which, during coating, received a rotation about a vertical axis; in order to deposit an alumina-doped silica layer on the inner wall of the tubes by the method according to the invention, use was made of a mixture of powders consisting of 93.4% by weight of silicon and 6.6% by weight of alumina;

the essential operating conditions were as follows:
Rate of Flow of Plasma Producing Gas (argon) = 30 l/min.
Rate of Flor of Powder Carrying Gas (argon) = 2 l/min.
Rate of Flow of Reactive Gas = argon 1/min.- +oxygen 4 l/min.
Rate of Flow of Powder + 25 g/hour; and
the electrical parameters of the high frequency generator were:
Current : 3.2 A
Voltage : 6000 V
Frequency : 8.2 MHz.

The coating obtained had a thickness of about 2 millimeters; their composition was approximately 94% silica and 6% alumina. The very porous coatings were made up of spherical particles of a mean diameter of 1000 Å.

Those four tubes thus coated were subjected successively to the following heat treatments carried out on a glass maker's horizontal lathe by means of an oxygen-propane blow torch displaced along the tube:

(a) densification (or sintering) of the coating by heating between 800 degrees Centigrade and 1000 degrees Centigrade, the interior of each tube being kept in vacuo at a pressure of $2 \times 10^{-2}$ Torr;

(b) vitrification of the coatings by moderate heating with a flow of helium until the coatings were converted to transparent coatings;

(c) finally, by increasing the heating power, progressive and regular hammering out of each tube into a solid bar or preform, the central part of which, formed by the initial vitrified and transparent coating, formed the core of each preform.

Finally, each preform was conventionally drawn into an optical fibre 200 μm in diameter and 40 μm core.

Having thus disclosed the invention, we now claim:

1. Plasma coating apparatus for uniformly coating with silica and dopant material optical fibre preforms from which optic fibres can be made by heating and drawing comprising:

a generally cylindrical double walled reactor having a covered top and an open bottom:

said reactor consisting of first, second and third cylindrical chambers in superposed vertical relation to each other, the first chamber being of lesser diameter on top of said reactor, the third chamber being on the bottom and of larger diameter and the second chamber being in the middle and of frustroconical shape for providing open communication between said first and third chambers along a common vertical axis of said reactor;

said first chamber being made of quartz and constituting a plasma heating zone into which ultrafine silicon powder and dopant powder are vaporized under heat and in the presence of injected plasma producing gas and injected silicon and dopant powders;

heating means comprising a radio frequency generator and an induction winding about said first chamber to vaporize injected silicon and dopant powders in a heating zone therein;

an ultrafine silicon powder storage means fitted with an outlet line to an injector from which said silicon powder is carried by argon fluidizing gas into a powder injector which projects downwardly through said top from said outlet line into said first chamber;

a dopant powder storage means fitted to said same outlet as said silicon powder storage means to mix with said silicon powder and be carried into the same powder injector as connected to said silicon powder means;

a powder injector axially projecting through the covered top of said reactor into position below the entry of a plasma producing gas at a location below the top but above the vaporization area of said plasma heating zone, said injector fed by argon fluidizing gas from said silicon powder means and said dopant powder means in the same line;

a plasma producing gas injector located near said top and above the outlet of said powder injector which injects fluidized argon transversely into said first chamber and tangentially to the mixed powder flow whereby heating and the velocity of said powder injector and said plasma producing gas injector creates turbulence in the mixture passing from the first chamber into said second chamber;

an oxygen injector for injecting at least one stream of oxygen into said second chamber transverse to the axis thereof whereby the vaporized mixture passing through said second chamber reacts with oxygen to convert the vaporized silicon metal into silica and the vaporized dopant into the oxide thereof which form microseeds of silica containing dopant in a size of about 1,000 Angstrom units under conditions of high turbulence and temperature of about 5000 Centigrade as measured at the outer side of said second chamber;

cooling means to strongly cool said third chamber within the double walls surrounding said third chamber, the cooling and larger diameter of said third chamber providing lesser turbulence at a Reynolds Number less than 3,500 and a quenching action to cool the microseeds for uniform deposition onto a substrate and to thereby produce a preform; and a support having openings therein and including a substrate in the path of deposition of said microseeds under quenching action in said third chamber to provide for the build up of deposited microseeds on said substrate while permitting the carrier gas and plasma producing gas to pass out of the open bottom of said reactor.

2. An apparatus as claimed in claim 1 wherein said dopant powder is aluminum powder and said substrate is a tube formed of silica.

3. An apparatus as claimed in claim 1 including an outlet conduit for the carrier gas and plasma producing gas at the bottom of said third chamber.

* * * * *